(12) United States Patent
Lee

(10) Patent No.: US 10,379,274 B2
(45) Date of Patent: Aug. 13, 2019

(54) COLOR FILTER AND DISPLAY PANEL

(71) Applicant: HANNSTAR DISPLAY CORPORATION, Taipei (TW)

(72) Inventor: Jiun-Haw Lee, Taipei (TW)

(73) Assignee: HANNSTAR DISPLAY CORPORATION, Taipei (TW)

( * ) Notice: Subject to any disclaimer, the term of this patent is extended or adjusted under 35 U.S.C. 154(b) by 215 days.

(21) Appl. No.: 15/385,874

(22) Filed: Dec. 21, 2016

(65) Prior Publication Data

US 2018/0088262 A1     Mar. 29, 2018

(30) Foreign Application Priority Data

Sep. 29, 2016    (CN) .......................... 2016 1 0863452

(51) Int. Cl.
| | |
|---|---|
| *G02B 5/20* | (2006.01) |
| *G02B 5/22* | (2006.01) |
| *G03F 7/00* | (2006.01) |
| *G02F 1/1335* | (2006.01) |
| *G02F 1/1368* | (2006.01) |
| *H01L 27/32* | (2006.01) |

(52) U.S. Cl.
CPC .......... *G02B 5/223* (2013.01); *G02F 1/1368* (2013.01); *G02F 1/133514* (2013.01); *G03F 7/0007* (2013.01); *H01L 27/322* (2013.01); *H01L 27/3244* (2013.01)

(58) Field of Classification Search
CPC . G03F 7/0007; G02B 5/223; G02F 1/133514; H01L 27/322

USPC ............................................... 430/7; 349/106
See application file for complete search history.

(56) References Cited

U.S. PATENT DOCUMENTS

| | | | | |
|---|---|---|---|---|
| 2002/0117080 A1* | 8/2002 | Okutsu | ................... | C09B 47/10 106/31.78 |
| 2014/0114077 A1* | 4/2014 | Kim | ..................... | C09B 47/067 548/402 |
| 2015/0042931 A1* | 2/2015 | Hsu | ........................ | G02B 5/223 349/106 |
| 2017/0253741 A1* | 9/2017 | Kim | ........................ | C09B 47/04 |

FOREIGN PATENT DOCUMENTS

| | | | |
|---|---|---|---|
| JP | 2010-072105 A | * | 4/2010 |
| KR | 2012-0087541 A | * | 8/2012 |

OTHER PUBLICATIONS

Computer-generated translation of JP 2010-072105 (Apr. 2010). (Year: 2010).*
Computer-generated translation of KR 2012-0087541 (Aug. 2012). (Year: 2012).*

* cited by examiner

*Primary Examiner* — John A McPherson
(74) *Attorney, Agent, or Firm* — Winston Hsu

(57) ABSTRACT

A color filter and a display panel, wherein the color filter includes a color correction material. In an absorption spectrum of the color correction material, a wavelength interval of the absorption spectrum with a visible light absorption rate smaller than 0.2 is from 150 to 180 nanometers.

8 Claims, 5 Drawing Sheets

COLOR FILTER AND DISPLAY PANEL

BACKGROUND OF THE INVENTION

1. Field of the Invention

The present invention relates to a color filter, particularly to a color filter including a color correction material which has narrow absorption spectrum to modify the filtering of the color filter and enhance the color purity of the color filter.

2. Description of the Prior Art

Recently, liquid crystal displays using light sources such as light emitting diodes (LED) to emit light and producing images by controlling the liquid crystal panel have been developed and widely used. In general, in order to display colorful images, the liquid crystal display needs to mix lights with at least three kinds of colors to achieve different color tones. The wavelengths of lights with the three primary colors (R/G/B) currently and widely used in the liquid crystal display are about 610 nm to 750 nm for red light, about 500 nm to 560 nm for green light and about 435 nm to 480 nm for blue light respectively. The liquid crystal displays are designed to have a wide range of white light emission spectrum, and white light is filtered into three primary colors through the color filters in each pixel unit. The intensity and the color tone of light emitted from each pixel unit are determined by adjusting the intensities of the three primary colors in the pixel unit. Therefore, increasing the color purity of the three primary colors in the pixels and mixing the three primary colors may lead to a wide range of color tones.

When the liquid crystal display uses the blue LEDs combined with yellow fluorescent powders as the white light sources and uses the white light sources combined with conventional color filters of three primary colors to provide lights with three primary colors, the blue light filtered by the blue color filter is directly emitted from the LED, hence having a narrow full width at half maximum (FWHM). The red light filtered by the red color filter has an emission spectrum, and a part of the emission spectrum that is in the range of longer wavelength can't be easily detected by human eye, hence the red light has less influence on the color purity. However, parts of the green light filtered by the green color filter which have longer and shorter wavelengths would decrease the color purity and influence the color gamut and the color tone. Hence, the display industries still need to go through more research and make improvement to related issues.

SUMMARY OF THE INVENTION

To increase the color purity of emitting light and the gamut of the current liquid crystal display, the present invention provides a color filter with a color correction material, which advantage is the color correction material has narrow absorption spectrum and can filter out light with specific wavelength range to provide better color tone. Furthermore, unlike the color correction layer being disposed on a light source of a back light module in the prior art, the filter units of the three primary colors of the color filters are respectively added with a corresponding color correction material in the present invention to increase the color purity of each primary color.

An object of the present invention is to provide a color filter, wherein a color correction material is comprised, and a wavelength interval of absorption spectrum of the color correction material with a visible light absorption rate smaller than 0.2 is from 150 to 180 nanometers.

Another object of the present invention is to provide a display panel comprising a first substrate, a second substrate disposed correspondingly to the first substrate, a display medium layer disposed between the first substrate and the second substrate, and a color filter disposed on a surface of the first substrate, wherein the color filter comprises the color correction material, and the wavelength interval of the absorption spectrum of the color correction material with a visible light absorption rate smaller than 0.2 is from 150 to 180 nanometers.

These and other objectives of the present invention will no doubt become obvious to those of ordinary skill in the art after reading the following detailed description of the preferred embodiment that is illustrated in the various figures and drawings.

DETAILED DESCRIPTION

In the following detail description, the element symbols are marked in the accompanying illustrations to be parts of them, and the description is described with the embodiment that is able to be implemented. Such embodiment explains sufficient details to allow the person skilled in the art to implement. Readers are required to understand that the present invention may also be utilized in other embodiments or embodiments without departing from the premise of making an example of structural, logical, and on changes in electrical properties. Therefore, the details described below are not seen as a kind of limit, on the contrary, the embodiments contained therein will be defined by the claims.

The term "FWHM", which means full width at half maximum, used in the present invention is to describe a full width of an absorption spectrum curve measured between two points at half of the maximum amplitude in the absorption spectrum curve (That is, the wavelength interval between two points of a half of the maximum amplitude). The value can be measured by ultraviolet/visible light spectrometer, which can tell the color purity of each color in the emission spectrum of display. In the present invention, the statement of modifying the color tones may represent or contain the way of selectively absorbing the intermediate lights between the primary lights, or selectively absorbing lights with certain wavelengths that decrease the color saturation.

Figure 1:
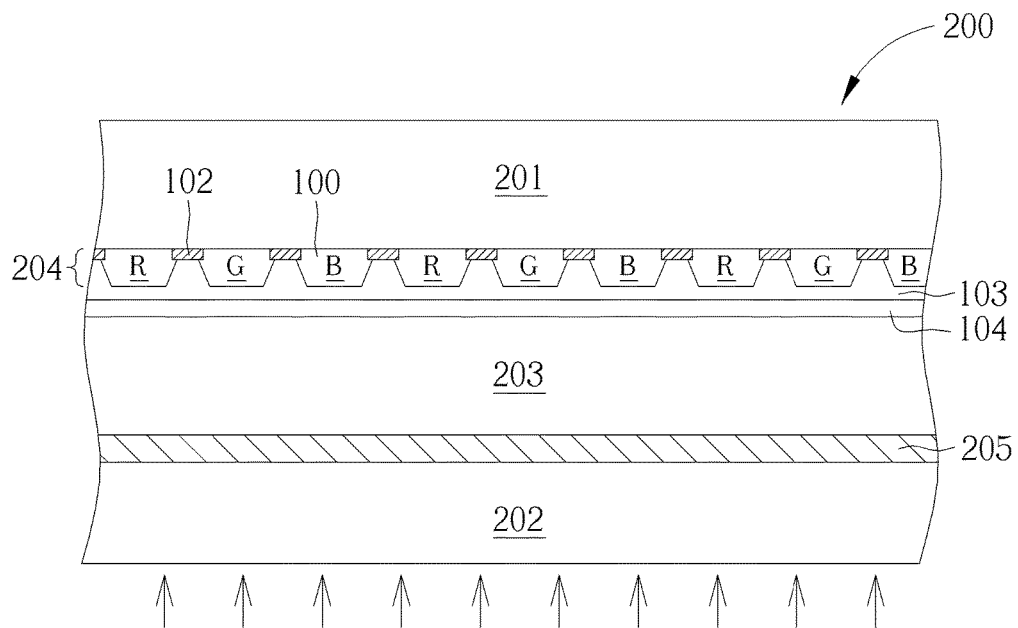
FIG. 1 is a cross-sectional view illustrating a color filter of a display panel according to a first embodiment of the present invention.
Figure 9:
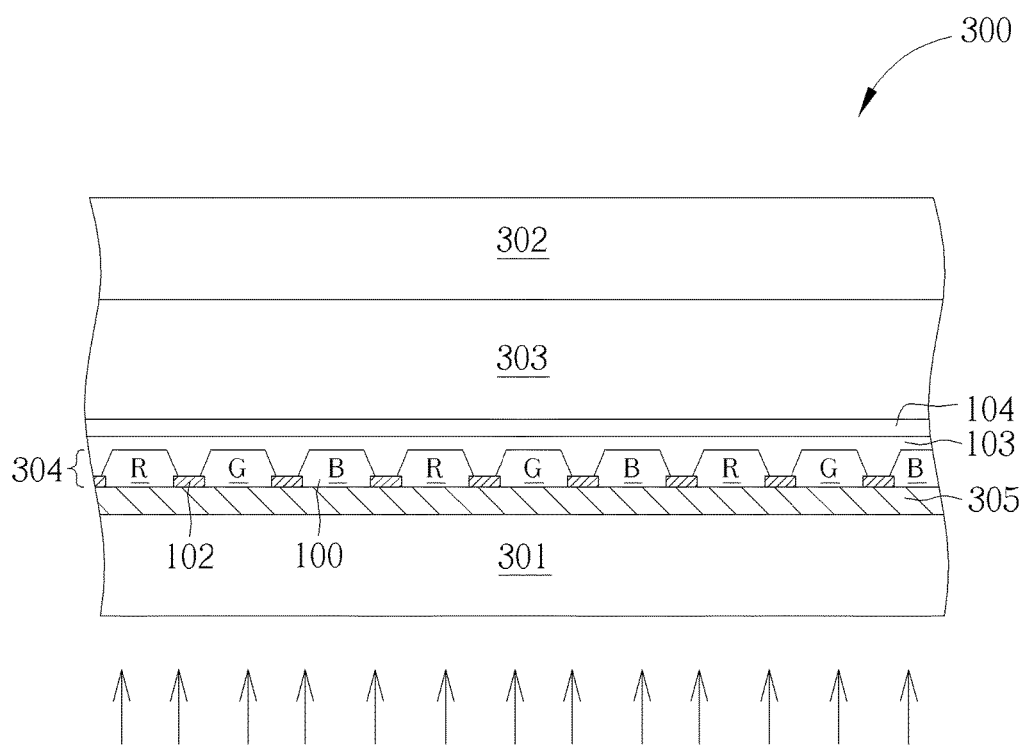
FIG. 9 is a cross-sectional view illustrating another color filter of a display panel according to a first embodiment of the present invention.

In the following description, several embodiments with figures and chemical formulas are provided to give a further understanding of the present invention, wherein FIG. 1 is a cross-sectional view illustrating a color filter of a display panel according to a first embodiment of the present invention, FIG. 2-8 are schematic diagrams illustrating absorption spectra of several color correction materials according to the embodiments of the present invention, and FIG. 9 is a cross-sectional view illustrating a color filter of a display panel according to another embodiment of the present invention.

According to the embodiments in the present invention, a color filter including a color correction material is provided. The wavelength interval of an absorption spectrum of the color correction material with a visible light absorption rate smaller than 0.2 is from 150 to 310 nanometers, wherein the wavelength of visible light is from 390 to 700 nanometer. More precisely, the color correction materials are selected preferably from at least one chemical group comprised by the following formulas (1) to (5).

[Formula (1)]

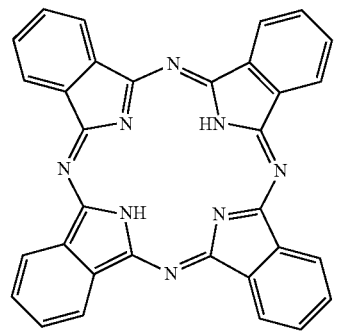

(1)

[Formula (2)]

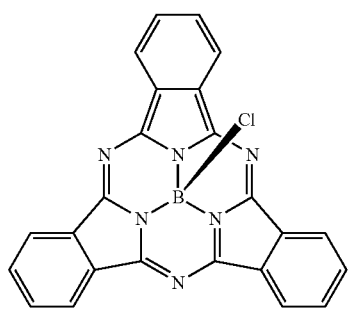

(2)

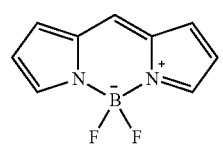

(3)

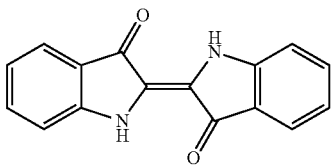

(4)

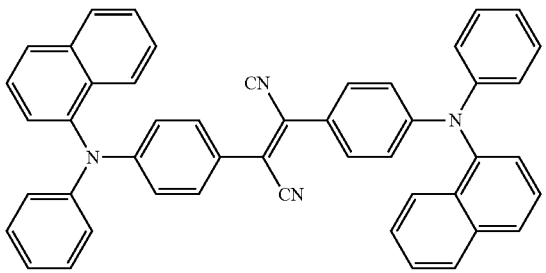

(5)

Phthalocyanine (Pc) is a macrocyclic aromatic compound with 18 pi-electrons. There is a void in the center of Pc to accommodate many metallic elements or non-metallic elements. Two hydrogen atoms in the central cavity can be replaced by roughly 70 elements which comprise almost all metallic elements and a part of non-metallic elements, thus forming metal phthalocyanine (MPc). Phthalocyanine and phthalocyanine derivatives have characteristics of bright colors, great colorability, good optical stability, good chemical stability and good thermal stability, and the central cavity is comparatively big, which can accommodate several types of elements.

Figure 2:
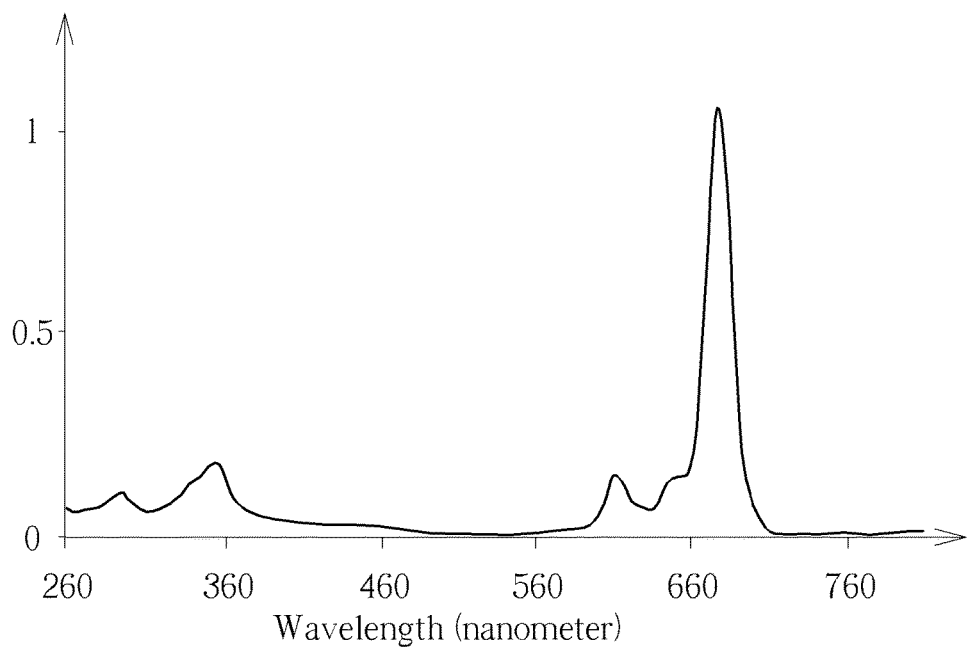
FIG. 2 is a schematic diagram illustrating an absorption spectrum of NiPc according to a first embodiment of the present invention.
Figure 7:
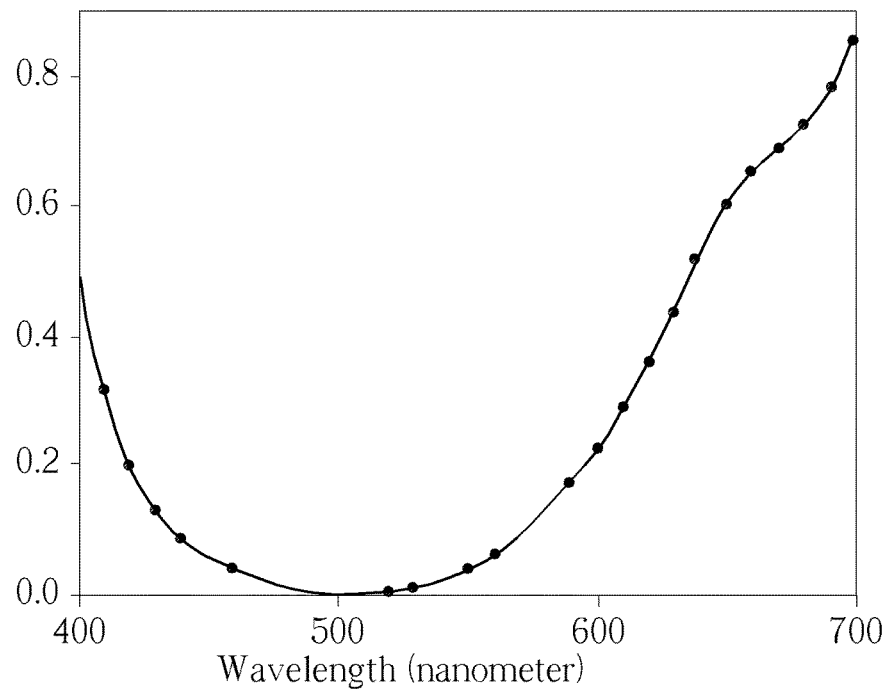
FIG. 7 is a schematic diagram illustrating an absorption spectrum of AlClPc according to a first embodiment of the present invention.
Figure 8:
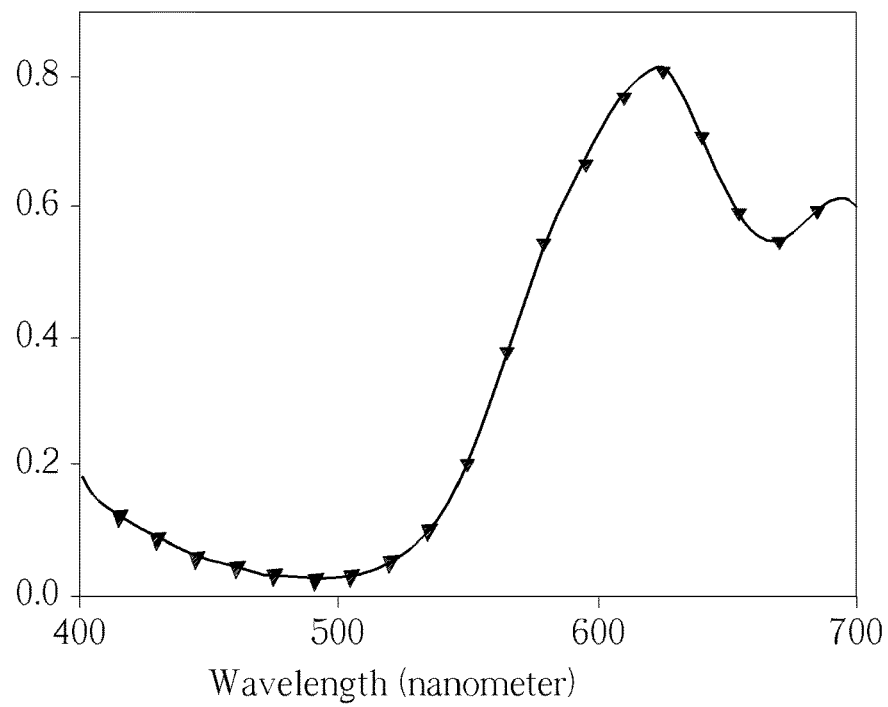
FIG. 8 is a schematic diagram illustrating an absorption spectrum of CuPc according to a first embodiment of the present invention.

The present invention uses metal phthalocyanine as the color correction material, metal in metal phthalocyanine can be for example copper (Cu), iron (Fe), cobalt (Co), zinc (Zn), tin (Sn), cadmium (Cd), nickel (Ni), titanium (Ti), or aluminium (Al), and can be replaced by at most 16 halogen atoms (e.g., chlorine or bromine). Preferable materials are chloro-aluminum phthalocyanine (AlClPc), copper (II) phthalocyanine (CuPc), zinc phthalocyanine (ZnPc) and so on. As shown in FIG. 7, the chloro-aluminum phthalocyanine has a high absorption rate except for green light (i.e. wavelength longer than 600 nm and shorter than 420 nm), which is suitable to correct the green primary light. In other words, the chloro-aluminum phthalocyanine is suitable to be the color correction material of the green color filter in the present invention. As shown in FIG. 2, the nickel (II) phthalocyanine has high absorption rate at red light wavelength (i.e. wavelength between 610 nm and 690 nm), which is suitable to filter red light, in other words, the nickel(II) phthalocyanine is suitable to be the color correction material of the blue or green color filter in the present invention.

[Formula (2)]

Subphthalocyanine (SubPc) is one of the most popular phthalocyanine compounds, which has high thermal stability and chemical stability similar to phthalocyanine, and the nearly flat conical structure of subphthalocyanine gives itself a non-linear optical characteristic better than that of planar molecules (e.g., phthalocyanine compound) and that of linear molecules, and the maximum absorption wavelength of subphthalocyanine is shorter than that of phthalocyanine. The general structure of subphthalocyanine shown in formula (2) is composed of three isoindole units connected to each other. The central atom is commonly boron. The boron atom is connected to nitrogen atoms in the rings and also connected to an axial anionic ligand, which is halogen or derivative of alkoxy groups in general.

Figure 3:
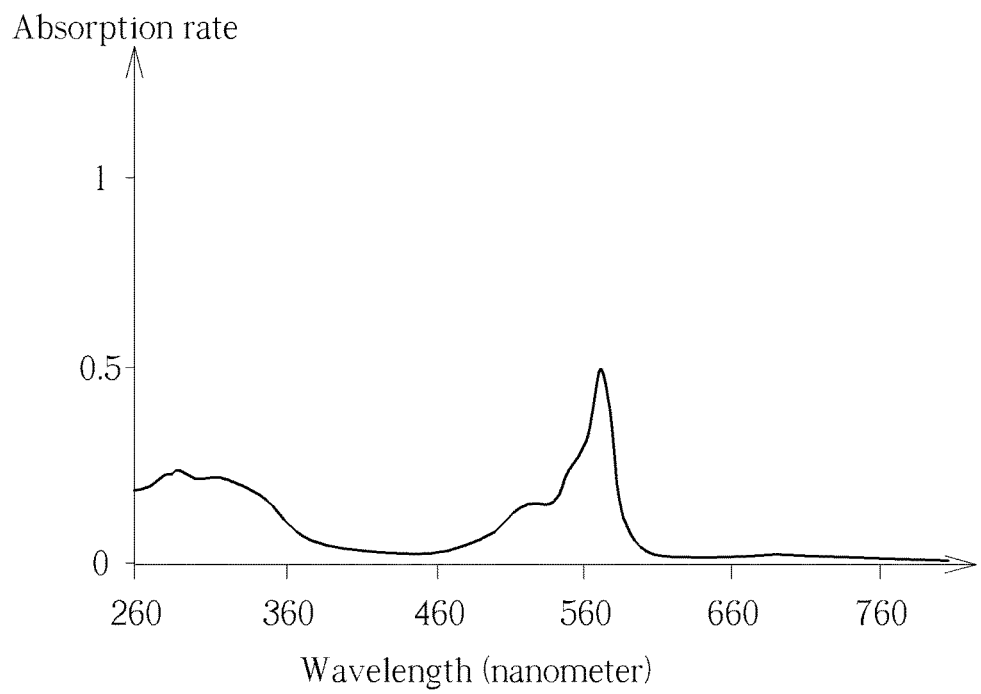
FIG. 3 is a schematic diagram illustrating an absorption spectrum of SubPc according to a first embodiment of the present invention.

In the present invention, subphthalocyanine compound can be used as the color correction material, as shown in FIG. 3. The subphthalocyanine compound has a high absorption rate at green wavelength (i.e. wavelength between 500 nm and 580 nm), which is suitable to correct the red primary light and the blue primary light and be used as the color correction material of the red color filter or the blue color filter in the present invention.

[Formula (3)]

Figure 4:
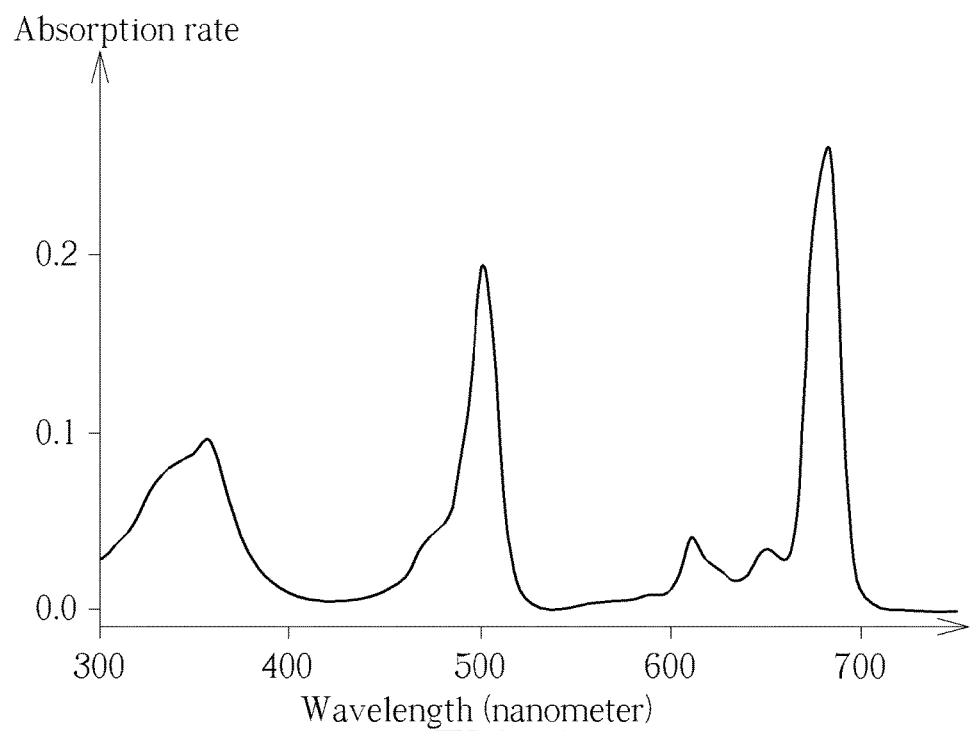
FIG. 4 is a schematic diagram illustrating an absorption spectrum of BODIPY according to a second embodiment of the present invention.

Boron-dipyrromethene (BODIPY), compared to traditional fluorescent compounds, has advantages such as high absorption, high quantum efficiency, narrow absorption spectrum, easy modification, modifiable range of spectrum and so on, so that BODIPY compounds can be widely used in environments and bioassays. BODIPY is also suitable to be applied in the color correction material of color filter. As shown in FIG. 4, after the BODIPY is partially substituted for phthalocyanine compound, it has high absorption rate except for green light (i.e. wavelength between 480 nm and 510 nm or between 670 nm and 690 nm), and is suitable to correct the green primary light. In other words, the BODIPY compound is suitably used in color correction material of the green color filter in the present invention.

[Formula (4)]

Figure 5:
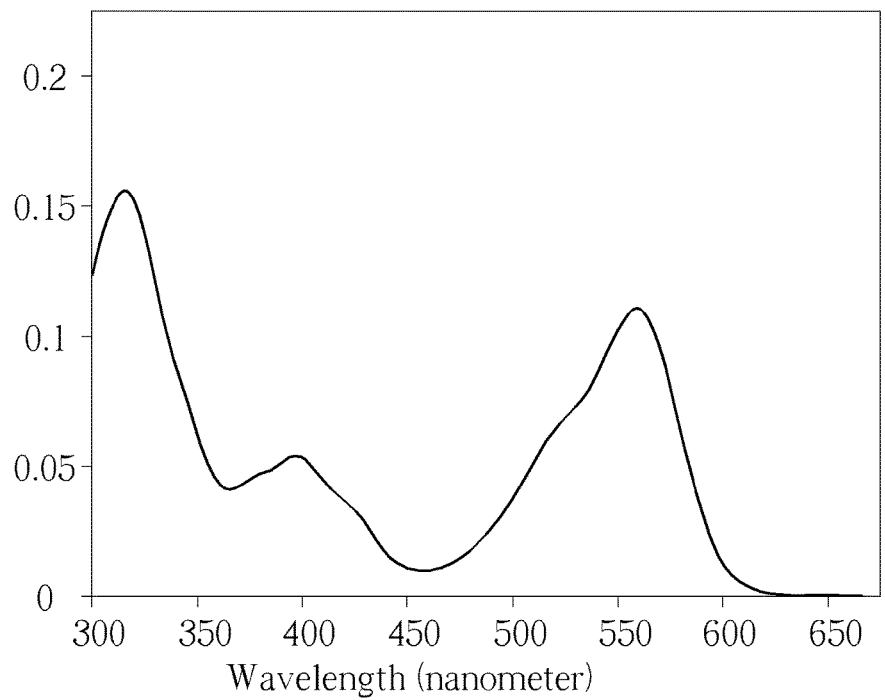
FIG. 5 is a schematic diagram illustrating an absorption spectrum of Indigoid according to a first embodiment of the present invention.

Indigoid is a polycyclic aromatic compound that is insoluble in water. The basic feature of molecular structure of the Indigoid is to contain two carbonyl groups in conjugated double bond systems, and carbon atoms of the carbonyl groups should be carbon atoms in the aromatic ring. The carbonyl groups are reduced by sodium dithionite in alkaline solution and become hydrocarbon group. In the present invention, indigoid such as Indigoid-A or Indigoid-B and so on may be used as the color correction material of the color filters after being treated by an ultrasonic process, as shown in FIG. 5. Indigoid has a high absorption rate except for blue light (wavelength longer than 492 nm, shorter than 442 nm), which is suitable to correct blue primary light and be used as the color correction material of the blue color filter in the present invention.

[Formula (5)]

Figure 6:
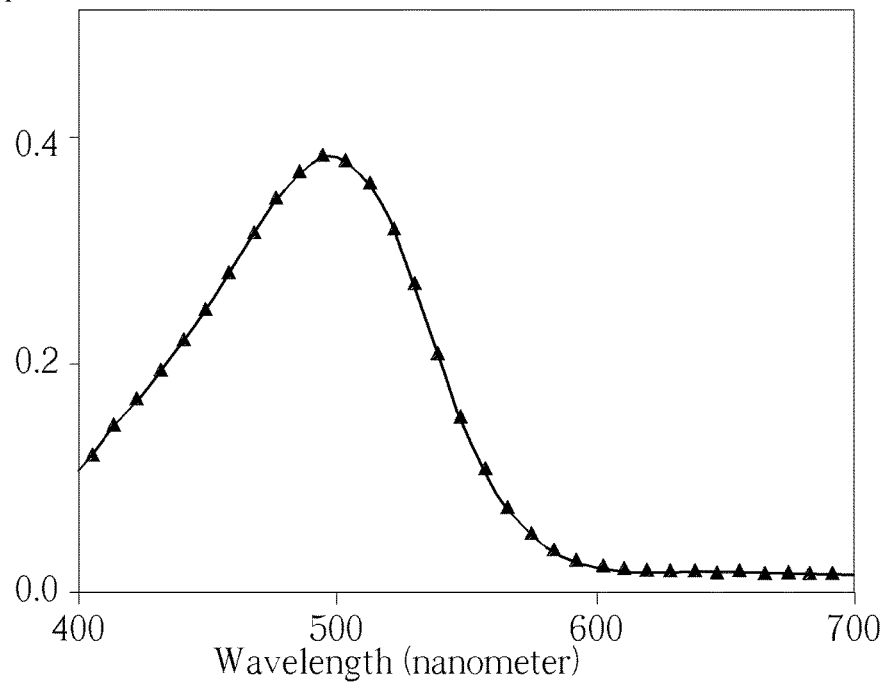
FIG. 6 is a schematic diagram illustrating an absorption spectrum of acene bisimide according to a first embodiment of the present invention.

Bis(4-(N-(1-naphthyl)pheny-lamino)phenyl)fumaronitrile (NPAFN) has different absorption rates for different wavelengths based on the different numbers of benzene rings therein. As shown in FIG. 6, it is discovered that NPAFN have high absorption rates in the wavelength below 550 nm, which are suitable to correct red primary light and be used as the color correction material of the red color filter in the present invention.

In the embodiments of the present invention, the feature of each of above mentioned materials used as the color correction material of the color filter is that the wavelength interval in the absorption spectrum of the color correction material with visible light absorption rate smaller than 0.2 is from 150 to 180 nanometers, which means the emission spectrum of light will have narrower FWHM and higher color purity after the light penetrates through the color filter including the above-mentioned color correction material. Furthermore, depending on the difference of the materials, the wavelength of absorption rate smaller than 0.1 may be between 440 nm and 460 nm, 510 nm and 550 nm or 600 nm and 620 nm, and may relate to the wavelength of one of blue/green/red (B/G/R) three primary colors, so that the materials are suitable to be color photoresist materials of B/G/R pixels in color filters.

In the present invention, color correction material may also comprise a dye of "J-aggregation" type made of one of the above mentioned materials. J-aggregation is a one-dimensional structure, multiple dye molecules aggregate in the direction vertical to the transition dipole moment (craniocaudal direction), and the deflection angles between molecules are small. The feature of the dye of the J-aggregation type is that the wavelength of the dye of the J-aggregation type shifts to longer than the dye of single molecule, the shifted wavelength range may be from 30 nm to 60 nm, and the dye of J-aggregation type has smaller FWHM as compared to single molecules-, e.g., smaller than 30 nm. The color correction material may further comprise multiple additives, such as antioxidants, ultraviolet absorbers and deoxidizers and so on to avoid material deterioration.

One of the features of the color correction material in the present invention is that the color correction material is added in the color filter, wherein the color filter used in the liquid crystal display panel. The color correction material may also be formed as a layer outside the color filter. For example, the color correction material may be disposed at the emission side of the color filter to further filter the color light penetrating through the color filter. Please refer to FIG. 1, which is a cross-sectional view illustrating a color filter 100 applied in a display panel 200 in the present invention. The color correction material of the color filter 100 is suitable to be applied in several types of display panels, e.g., liquid crystal displays (LCD) or electroluminescent displays (ELD), to provide light with high color purity and wide color gamut. As shown in FIG. 1, the structure of a display panel 200 comprises a substrate 201, a second substrate 202, a display medium layer 203 and a color filter layer 204, wherein the second substrate 202 is disposed correspondingly to the first substrate 201, the medium layer 203 is disposed between the first substrate 201 and the second substrate 202, the color filter 204 is disposed on a surface of the first substrate 201 and between the first substrate 201 and the display medium layer 203. In this embodiment, the surfaces of the first substrate 201 and the second substrate 202 may further comprise other layers or films selectively, e.g., polarizing plates, protection films, retarder films, alignment layers and so on, but not limited thereto. The display medium layer 203 may comprise a liquid crystal layer, an organic material layer or an electroluminescent layer. For example, when the display medium layer 203 is the organic material layer or the electroluminescent layer, the light emitted from the display medium layer 203 is preferably white light, but not limited thereto. Besides, when the display medium layer 203 is the liquid crystal layer, the display panel 200 may further comprise a backlight unit (not illustrated) disposed at an outer side of the second substrate 202 as a light source. The color filter layer 204 may comprise two or more color filters 100 with two or more colors. In this embodiment, the color filter 100 of the color filter layer 204 in each pixel comprises one of—red, green or blue color filter, as R, G, and B illustrated in FIG. 1, and the color filters 100 with different colors in neighboring pixels are separated by a light shielding layer 102. Besides, the display panels 200 may further comprise a flat layer 103 covering the surface of the whole color filter layer 204, and a transparent electrode film 104 is further disposed on the flat layer 103, e.g., indium tin oxide (ITO). The transparent electrode film 104 can be used as a common electrode, but not limited thereto. The transparent conducting film 104 may also be disposed on a surface of the second substrate 202. A switch component layer 205 can further be disposed on the surface of the second substrate 202 of the display panel 200, which may comprise a switch device, such as a thin film transistor, a pixel electrode, a scan line and a data line, but not limited thereto, while the second substrate 202 is an array substrate. In a variant embodiment, as shown in FIG. 9, the switch component layer 305 may be disposed on the surface of the first substrate 301 and between the first substrate 301 and the color filter 304, while the first substrate 301 is an array substrate. Besides, when the display medium layer 303 is the liquid crystal layer, the display panel 300 may comprise the backlight unit (not illustrated) disposed at an outer side of the second substrate 301 as light source. The other detailed features of the display panel 300 in the present invention are well-known in this field and are not detailed redundantly.

According to the present invention, the color correction materials in the color filters with different colors are not totally the same, and the selection of the color correction materials may refer to previous paragraphs. For example, in one embodiment, the red color filters 100(R) corresponding to red pixels can be formed of the color correction material for red color, or at least comprise the color correction material for red color, e.g., acene bisimide. According to the absorption spectrum in FIG. 6, acene bisimide has an absorption rate lower than 0.1 for the wavelength of light above 560 nm, and the absorption rate can be even lower than 0.05 for the wavelength of light above 600 nm, which correspond to a red primary light with the wavelength between 605 nm and 655 nm. So the red primary light with high purity can be got by using acene bisimide in red pixels. Furthermore, the green color filters 100(G) corresponding to green pixels can be formed by color correction material for green color, or at least comprise the color correction materials for green color, e.g., AlClPc. According to the absorption spectrum in FIG. 7, AlClPc has an absorption rate lower than 0.2 for the wavelength of light between 420 nm and 600 nm, and the absorption rate can be even lower than 0.05 for the wavelength of light between 507 nm and 557 nm. So the green primary light with high purity can be got by using AlClPc in green pixels. Lastly, the blue color filters 100(B) corresponding to blue pixels can be formed by the color correction material for blue color, or at least comprise the color correction material for blue color, e.g., CuPc mentioned previously. According to the absorption spectrum in FIG. 8, CuPc has an absorption rate lower than 0.2 for the wavelength of light between 400 nm and 550 nm, and the absorption rate can be even lower than 0.05 for the wavelength of light between 440 nm and 490 nm. So the blue primary light with high purity can be got by using CuPc in blue pixels. For the above mentioned color correction materials of the pixels, the wavelength interval of each of the color correction materials with a visible light absorption rate smaller than 0.2 in the absorption spectrum is from 150 to 180 nanometers. It is noted that according to the present invention, a single color filter 100 may comprise different color correction materials mixed with each other, for example, a longer wavelength and a shorter wavelength may be filtered by the different color correction materials with different absorption rates for lights with different wavelengths.

In other embodiments, the color correction material is not added directly in each color filter. A color correction layer formed by one of the above mentioned color correction materials—is disposed at one side of the color filter layer to correct each of the three primary lights or to correct all of the lights, depending on the requirements of the present invention. For example, in a situation of using a white light generated by a blue LED with yellow fluorescent powder of yttrium aluminium garnet (YAG) as light source, the wavelength of the green light in the emission spectrum of the white light needs to shift to shorter wavelength so as to get wider green color gamut. The FWHM of the green light needs to be decreased as well to get the green light with higher purity. In such circumstance, the color correction layer made of the above mentioned AlClPc for the green light may be disposed in the color filter to make an entire correction.

The main feature of the color correction material used in the color filter in the present invention is that the wavelength interval of the color correction material with a visible light absorption rate smaller than 0.2 in the absorption spectrum is from 150 to 180 nanometers, or less than or equal to 180 nm. That is to say, the wavelength interval of the visible light able to penetrate through the color correction material is only from 150 nm to 180 nm, so the wavelength distribution of light within this wavelength interval shows a more concentrated distribution, and thus the light can have better color purity. Furthermore, in the application of this field, the color correction material selectively filters out undesired lights or impure intermediate lights to increase the color purities of the three primary colors, and the decreasing of brightness of the display panel can be avoided. And it improves the color tones of images and obtains great durability. The present invention has wide applications, including office equipment such as desktop computer, laptop, printer and so on, mobile equipment such as phone, watch, digital camera, personal digital assistant, handheld game console and so on, or household appliances such as digital video camera, television unit and so on, or automobile equipment such as back view monitor, automobile navigation system, vehicle audio and so on.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A color filter comprising a color correction material, wherein in an absorption spectrum of the color correction material, a wavelength interval of the absorption spectrum with a visible light absorption rate smaller than 0.2 is from 150 to 310 nanometers, and a wavelength of the visible light is from 390 to 700 nanometers, wherein the visible light absorption rate of the color correction material in a wavelength above 560 nanometers is smaller than 0.1, the color filter is a red color filter, and the color correction material comprises bis(4-(N-(1-naphthyl)pheny-lamino)phenyl)fumaronitrile.

2. The color filter according to claim 1, wherein the visible light absorption rate of the color correction material in a wavelength between 440 nm and 460 nm, 510 nm and 550 nm or 600 nm and 620 nm is smaller than 0.1.

3. The color filter according to claim 1, wherein the color filter comprises a color correction layer, and the color correction layer comprises the color correction material.

4. A display panel, comprising:
a first substrate;
a second substrate disposed correspondingly to the first substrate;
a display medium layer disposed between the first substrate and the second substrate, and
the color filter according to claim 1 disposed on a surface of the first substrate.

5. The display panel according to claim 4, further comprising a switch component layer disposed on a surface of the second substrate and between the second substrate and the display medium layer.

6. The display panel according to claim 4, further comprising a switch component layer disposed on the surface of the first surface and between the first substrate and the color filter.

7. The display panel according to claim 4, wherein the display panel comprises two or more the color filters with two or more colors, and the color correction materials in the color filters with different colors are not entirely the same.

8. The display panel according to claim 4, wherein the display medium layer is an organic light-emitting material layer or a liquid crystal layer.

* * * * *